(12) United States Patent
Reilly et al.

(10) Patent No.: US 10,090,817 B2
(45) Date of Patent: Oct. 2, 2018

(54) SYSTEM AND METHOD FOR LEVELING LOUDNESS VARIATION IN AN AUDIO SIGNAL

(71) Applicant: DOLBY LABORATORIES LICENSING CORPORATION, San Francisco, CA (US)

(72) Inventors: Andrew P. Reilly, Hurlstone Park (AU); Michael Smithers, Kareela (AU); Jeffrey Riedmiller, Penngrove, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/946,414

(22) Filed: Apr. 5, 2018

(65) Prior Publication Data

US 2018/0234065 A1  Aug. 16, 2018

Related U.S. Application Data

(63) Continuation of application No. 15/718,913, filed on Sep. 28, 2017, now Pat. No. 9,960,742, which is a
(Continued)

(51) Int. Cl.
H03G 3/00 (2006.01)
H03G 3/20 (2006.01)
H03G 7/00 (2006.01)

(52) U.S. Cl.
CPC ............... *H03G 3/20* (2013.01); *H03G 7/002* (2013.01); *H03G 7/007* (2013.01)

(58) Field of Classification Search
CPC .. H03G 3/00; H03G 3/20; H03G 3/24; H03G 3/32; H03G 3/3005; H03G 3/3089;
(Continued)

(56) References Cited

U.S. PATENT DOCUMENTS 7,454,331 B2  11/2008  Vinton
8,090,120 B2   1/2012  Seefeldt
(Continued)

FOREIGN PATENT DOCUMENTS

JP  2010-537233  12/2010
JP     5129806   11/2012
(Continued)

OTHER PUBLICATIONS

ATSC A/85 "Techniques for Establishing and Maintaining Audio Loudness for Digital Television" Document A/85: 2011, Jul. 25, 2011.
(Continued)

*Primary Examiner* — William A Jerez Lora

(57) ABSTRACT

Systems and methods for leveling loudness variation in an audio signal are described. Embodiments use both a perceptual leveling algorithm and a standards-based loudness measure together to minimize audio process artifacts and ensure that the measured loudness of the processed audio is close to a required measure, according to a particular standard measurement of loudness. These systems and methods can be used either offline or in real-time.

20 Claims, 7 Drawing Sheets

Related U.S. Application Data continuation of application No. 14/391,990, filed as application No. PCT/US2013/034989 on Apr. 2, 2013, now Pat. No. 9,806,688.

(60) Provisional application No. 61/739,545, filed on Dec. 19, 2012, provisional application No. 61/623,253, filed on Apr. 12, 2012.

(58) Field of Classification Search
CPC .......... H03G 7/00; H03G 7/002; H03G 7/007; H03G 9/00; H04R 2430/01
USPC ........ 381/60, 73.1, 101, 102, 104, 106, 107, 381/312, 314, 320
See application file for complete search history.

(56) References Cited

U.S. PATENT DOCUMENTS

| | | | |
|---|---|---|---|
| 8,213,624 B2 | 7/2012 | Seefeldt | |
| 8,437,482 B2 | 5/2013 | Seefeldt | |
| 8,761,415 B2 | 6/2014 | Smithers | |
| 2005/0078840 A1* | 4/2005 | Riedl | H03G 7/007 381/104 |
| 2008/0253586 A1* | 10/2008 | Wei | H03G 5/165 381/107 |
| 2009/0046873 A1 | 2/2009 | Riedl | |
| 2009/0074209 A1 | 3/2009 | Thompson | |
| 2009/0116664 A1 | 5/2009 | Smirnov | |
| 2009/0161883 A1 | 6/2009 | Katsianos | |
| 2009/0271185 A1* | 10/2009 | Smithers | H03G 7/007 704/225 |
| 2010/0046765 A1 | 2/2010 | De Bruijn | |
| 2010/0128904 A1* | 5/2010 | Hanna | H03G 3/3005 381/107 |
| 2010/0272290 A1 | 10/2010 | Carroll | |
| 2011/0150242 A1 | 6/2011 | Zong | |
| 2011/0255712 A1* | 10/2011 | Urata | H03G 9/005 381/107 |
| 2012/0063616 A1 | 3/2012 | Walsh | |

FOREIGN PATENT DOCUMENTS

| | | |
|---|---|---|
| WO | 2007/120453 | 10/2007 |
| WO | 2007/127023 | 11/2007 |
| WO | 2010/044439 | 4/2010 |
| WO | 2010/129395 | 11/2010 |

OTHER PUBLICATIONS

FCC-11-84A1 "Implementation of the Commercial Advertisement Loudness Mitigation (CALM,) Act" released on May 27, 2011.
Grimm, E. et al "Determining an Optimal Gated Loudness Measurement for TV Sound Normalization" AES Convention: 128, Network, Internet, and Broadcast Audio, published on May 1, 2010, paper No. 8154.
ITU-R BS.1770-1 "Algorithms to Measure Audio Programme Loudness and True-peak Audio Level" (2006-2007).
ITU-R BS.1770-2 "Algorithms to Measure Audio Programme Loudness and True-Peak Audio Level" Mar. 2011.
Lavoie, M. et al "Development and Evaluation of Short-Term Loudness Meters" Communications Research Centre, AES Convention: 121, Oct. 1, 2006, Paper No. 6889.
Riedmiller, J. et al "Practical Program Loudness Measurement for Effective Loudness Control" AES Convention: 118, published on May 1, 2005, paper No. 6348.

* cited by examiner

SYSTEM AND METHOD FOR LEVELING LOUDNESS VARIATION IN AN AUDIO SIGNAL

CROSS-REFERENCE TO RELATED APPLICATIONS

This application is a continuation of U.S. patent application Ser. No. 15/718,913 filed 28 Sep. 2017, which is a continuation of U.S. patent application Ser. No. 14/391,990 filed 10 Oct. 2014, which is a 371 of International Patent Application PCT/US2013/034989 filed 2 Apr. 2013, which claims priority to U.S. Patent Provisional Application No. 61/623,253 filed 12 Apr. 2012 and U.S. Patent Provisional Application No. 61/739,545 filed 19 Dec. 2012, all of which are hereby incorporated by reference in their entirety.

FIELD

The present disclosure relates generally to signal processing, and more particularly, to systems and methods for leveling loudness variation in an audio signal.

BACKGROUND

Loudness leveling, or the automatic reduction of the range between loud and soft sections of an audio signal, is desirable in many situations, particularly with respect to broadcast television networks. Poor authoring practices lead to wide variation in loudness levels within a television program, advertisement or both, and programs or advertisements with significantly different loudness levels are frequently concatenated. Television viewers often find themselves adjusting the volume control on their television or sound playback system to compensate for these variations; however, the reaction time of such viewers is often not fast enough to avoid annoyance. In addition, some programs (such as movies) have a very high dynamic range. These ranges are often too wide for home listening, where the volume position required to hear dialogue may result in very loud levels for sound effects and music, which can disturb others in the household.

Existing methods for loudness leveling include compressor and limiter methods. These methods integrate audio signal level or power over time. The shorter the integration time, the faster the algorithm can measure and adjust short term fluctuations in loudness. The longer the integration time, the more the average loudness is affected, but short term fluctuations persist. These methods typically operate by gain adjusting the whole audio signal, i.e., all frequencies at once. This can result in audible artifacts, such as "breathing" or "pumping". More recently, psychoacoustic methods for loudness measurement and adjustment have been developed, such as those described in U.S. Patent Application Publication No. 2007/0092089 A1 to Seefeldt et al., published Apr. 26, 2007, herein incorporated by reference in its entirety. These algorithms use spectral analysis and models of human hearing to adjust the audio in ways that vary across frequency and vary with measured loudness level. These methods work well in adjusting short term loudness on millisecond to second timescales, with very few audible artifacts. US2010/0046765A1 describes a television device comprising a first section configured to estimate a long-term arithmetic average of loudness, and a second section configured to suppress short bursts of loudness. US2007/0291959A1 describes a method for calculating and adjusting the perceived loudness. US2008/0253586A1 describes a system and method for controlling audio loudness. US2010/0272290A1 describes a method for improving loudness consistency at program boundaries. US2011/0150242A1 describes a method for adaptive loudness leveling. WO2007/127023A1 describes an audio gain control using specific loudness based auditory event detection.

Separate from loudness levels, methods also exist for objectively measuring the perceived loudness of audio signals. Examples include A-, B-, and C-weighted power measures, as well as psychoacoustic models of loudness, such as those described in "Acoustics—Method for calculating loudness level," ISO 532 (1997), and in U.S. Patent Application Publication No. 2007/0092089 A1. Weighted power measures operate by taking an input audio signal, applying a known filter that emphasizes more perceptibly sensitive frequencies, while deemphasizing less perceptibly sensitive frequencies, then averaging the power of the filtered signal over a predetermined length of time. The recently developed ITU-R BS.1770-2 objective loudness measurement standard uses a weighting filter similar to B-weighting, and removes parts of the audio signal that are quiet or silent from the final average power calculation.

Psychoacoustic methods are typically more complex and aim to better model the workings of the human ear. Such psychoacoustic methods divide the signal into frequency bands that mimic the frequency response and sensitivity of the ear, then manipulate and integrate such bands while taking into account psychoacoustic phenomena, such as frequency and temporal masking, as well as the non-linear perception of loudness with varying signal intensity. The aim of all such methods is to derive a numerical measurement that closely matches the subjective impression of the audio signal. These methods are typically useful for measuring the longer term perceived loudness of an audio signal, e.g., where the audio signal length is 30 seconds or more, and typically minutes or hours. Over many years, the development and acceptable of these objective measurement algorithms has been accompanied by subjective testing, i.e., comparing the objective algorithm's measurements to human listening.

Recently, there has been a growing need for broadcast television audio signals to maintain a consistent loudness, particularly with respect to commercials. This need has been driven by government regulation, such as by Federal Communications Commission Publication No. FCC 11-84, "Notice of Proposed Rulemaking: Implementation of the Commercial Advertisement Loudness Mitigation (CALM) Act". Since broadcasters have a mixture of well-authored content with known average loudness and dynamics and unknown content with unknown average loudness and possibly wide dynamics, they frequency use loudness leveling equipment in-line with the real-time audio signal that eventually makes its way to the television viewer. However, loudness levelers are typically optimized for short-term behavior to minimize artifacts when level-adjusting the audio signal, and as a result, the leveled audio signal is not necessarily consistent when measured using longer term measures. That is, the measured loudness of the sections of the leveled audio, e.g., 30 seconds or more, is not consistent.

SUMMARY

Thus, there is a need in the art for a real-time leveling method that can perform short-term artifact-free loudness leveling, while ensuring that the longer term loudness of the leveled audio matches a known measurement standard.

Embodiments of the invention meet this need and others by providing a system and method for leveling loudness variation in an audio signal.

According to one embodiment, a method for leveling loudness variation in an audio signal is described. The method comprises receiving the audio signal and a desired loudness of the audio signal, removing artifacts from the audio signal, measuring an actual loudness of the audio signal, calculating a gain value using a difference between the desired loudness and the actual loudness of the audio signal, and modifying the audio signal using the gain value.

According to another embodiment, a system for leveling loudness variation in an audio signal is described. The system comprises a short term loudness leveling module configured to receive the audio signal and a desired loudness of the audio signal and to remove artifacts from the audio signal, a long term loudness leveling module configured to measure an actual loudness of the audio signal, a loudness to gain module configured to calculate a gain value using a difference between the desired loudness and the actual loudness of the audio signal, and an audio modification module configured to modify the audio signal using the gain value. In one embodiment, at least one of the short term loudness leveling module, the long term loudness leveling module, the loudness to gain module and the audio modification module are comprised in a processor.

According to another embodiment, a computer readable medium having computer executable instructions embedded thereon is described for performing the steps of receiving the audio signal and a desired loudness of the audio signal, removing artifacts from the audio signal, measuring an actual loudness of the audio signal, calculating a gain value using a difference between the desired loudness and the actual loudness of the audio signal, and modifying the audio signal using the gain value.

Still other aspects, features and advantages of the present invention are readily apparent from the following detailed description, simply by illustrating a number of exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

DETAILED DESCRIPTION

A system and method for leveling loudness variation in an audio signal is described. In the following description, for purposes of explanation, numerous specific details are set forth in order to provide a thorough understanding of the exemplary embodiments. It is apparent to one skilled in the art, however, that embodiments can be practiced without these specific details or with an equivalent arrangement. In some instances, well-known structures and devices are shown in block diagram form in order to avoid unnecessarily obscuring the embodiments.

Figure 1:
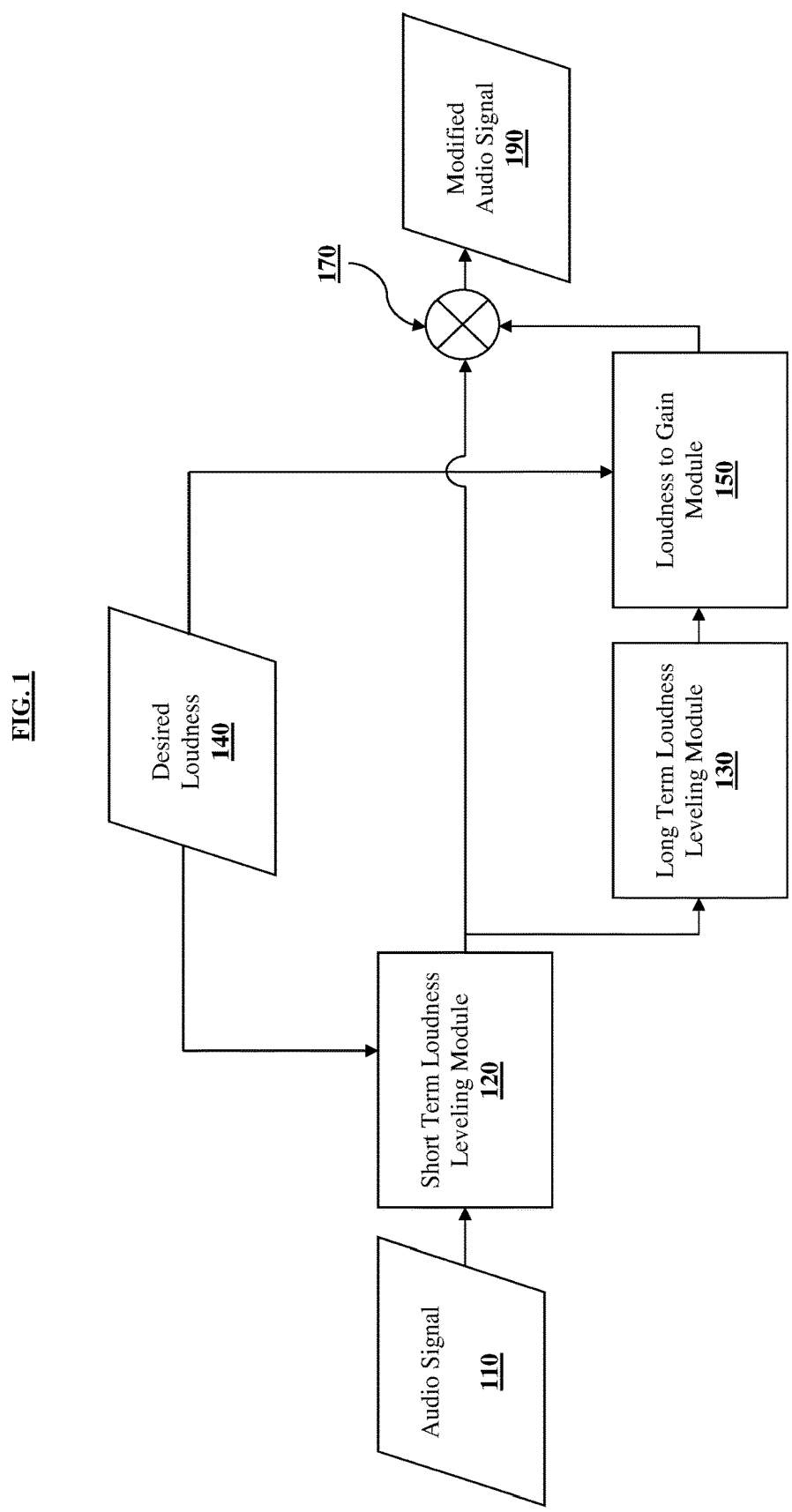
FIG. 1 is a schematic functional block diagram illustrating a system for leveling loudness variation in an audio signal in real-time according to an embodiment.

Referring now to the drawings, wherein like reference numerals designate identical or corresponding parts throughout the several views, FIG. 1 is a schematic functional block diagram illustrating a system for leveling loudness variation in real-time according to one embodiment. An audio signal 110 and a desired loudness 140 of the audio signal are input into short term loudness leveling module 120. Short term loudness leveling module 120 adjusts audio signal 110 to minimize audible leveling artifacts, such as "pumping" and "breathing". Short term loudness leveling module 120 may accomplish this by the methods described in U.S. Patent Application Publication No. 2007/0092089 A1, herein incorporated by reference in its entirety.

In one embodiment, short term loudness leveling module 120 operates on time intervals of 5 milliseconds of digital pulse code modulation ("PCM") audio, i.e., a 5 millisecond period. In another embodiment, short term loudness leveling module 120 operates continuously, as in an analog system. In still another embodiment, short term loudness leveling module 120 operates on every PCM sample in a digital system.

Short term loudness leveling module 120 also takes desired loudness 140 of the audio signal as input. In a digital system where the audio signal is a PCM signal, desired loudness 140 is expressed in units of decibels (dB) relative to the full-scale PCM. For example, desired loudness 140 may be −24 dB FS (full-scale).

The audio signal processed by short term loudness leveling module 120 is then passed to long term loudness leveling module 130. Long term loudness leveling module 130 measures the actual loudness of the audio signal according to a chosen objective loudness measurement standard, such as, for example, ITU-R BS.1770-3 (08/2012). Long term loudness leveling module 130 outputs a single loudness number for every period, i.e., every time the actual loudness of the audio signal is measured. The loudness number represents the actual loudness of the audio signal. In a digital system where the audio signal is a PCM signal, the loudness number is expressed in units of decibels (dB) relative to full-scale PCM.

Long term loudness leveling module 130 is set to a nominal integration time, such as, for example, 30 seconds, in one embodiment. This integration time is the time interval of PCM samples which long term loudness leveling module 130 uses to calculate a single loudness number. This function may operate more frequently than the integration time interval; however, each time is operates, it outputs a number representing a measurement over the last "integration time interval" PCM samples it has received.

In one embodiment, long term loudness leveling module 130 operates at the same rate as short term loudness leveling module 120, such as, for example, every 5 milliseconds. In other embodiments, long term loudness leveling module 130 operates at slower or faster rates than short term loudness leveling module 120. For example, long term loudness leveling module 130 may operate every 20 milliseconds, or once for every four times the short term loudness leveling module 120 performs its function.

Long term loudness leveling module 130 may include, in one embodiment, a mode of operation in which the integration of PCM samples (to calculate a single loudness number) only occurs when a block of PCM samples, typically representing a time interval of 0.5 seconds, are classified as "dialogue" by the algorithm described in ITU-R BS.1770-1 (2006-2007), which is herein incorporated by reference in its entirety. This approach gates the loudness measure on the dialogue portions of the audio signal only. Alternatively, for geographical regions implementing regulatory requirements for loudness measurement and control (e.g., the Netherlands, Germany, Austria, France), long term loudness leveling module 130 can be operated in a mode that solely complies with ITU-R BS.1770-2 (03/2011) or ITU-R BS.1770-3 (08/2012), which specify a level-based gating technique, and are herein incorporated by references in their entireties.

Loudness to gain module 150 takes the loudness number and compares it with the desired loudness 140. Specifically, loudness to gain module 150 calculates the difference between desired loudness 140 and the loudness number, and outputs a gain value. This gain, which is applied to the leveled audio by audio modification module 170 to create the modified audio signal 190, brings the long term measure of the leveled audio signal closer to the desired loudness 140.

The calculation of gain value includes some rate limiting to prevent the gain value from changing too quickly and causing audible artifacts. This is particularly important when the process starts and the long term loudness leveling module 130 has not yet received sufficient audio samples to output a relevant loudness number. In one embodiment, loudness to gain module 150 operates at the same rate as long term loudness leveling module 130, such as, for example, 20 milliseconds, and the actual gain applied to the leveled audio signal is linearly interpolated between each gain value that is calculated every 20 milliseconds.

The gain value (in decibels) may be calculated according to the following equations.

$$D = \text{DesiredLoudness} - \text{LoudnessNumber} \text{ (in units of dB)} \quad [1]$$

$$H = \max(\min(D, G_{prev}+T), G_{prev}-T) \quad [2]$$

$$G_{curr} = G_{prev} + \max\left(\min\left(D-H, \frac{R_{up}}{S}\right), \frac{R_{down}}{S}\right) \quad [3]$$

$$GV = \max(\min(G_{curr}, L), -L) \quad [4]$$

Where:
T is a hysteresis value, i.e., the change in gain adjustment needs to exceed this value in order to make the gain value move, e.g., for example, 0.1 dB.
$R_{up}$ is the maximum rise of gain allowed per time interval, e.g., 0.04 dB per second.
$R_{down}$ is the maximum fall of gain allowed per time interval, e.g., 0.08 dB per second.
S is the number of times per second that the gain value is updated, e.g., 50 times per second.
G is the internal state of the loudness to gain function, typically initialized to 0 dB.
L is a limit placed on the gain value, e.g., ±4 dB.
GV is the gain value.

Figure 2:
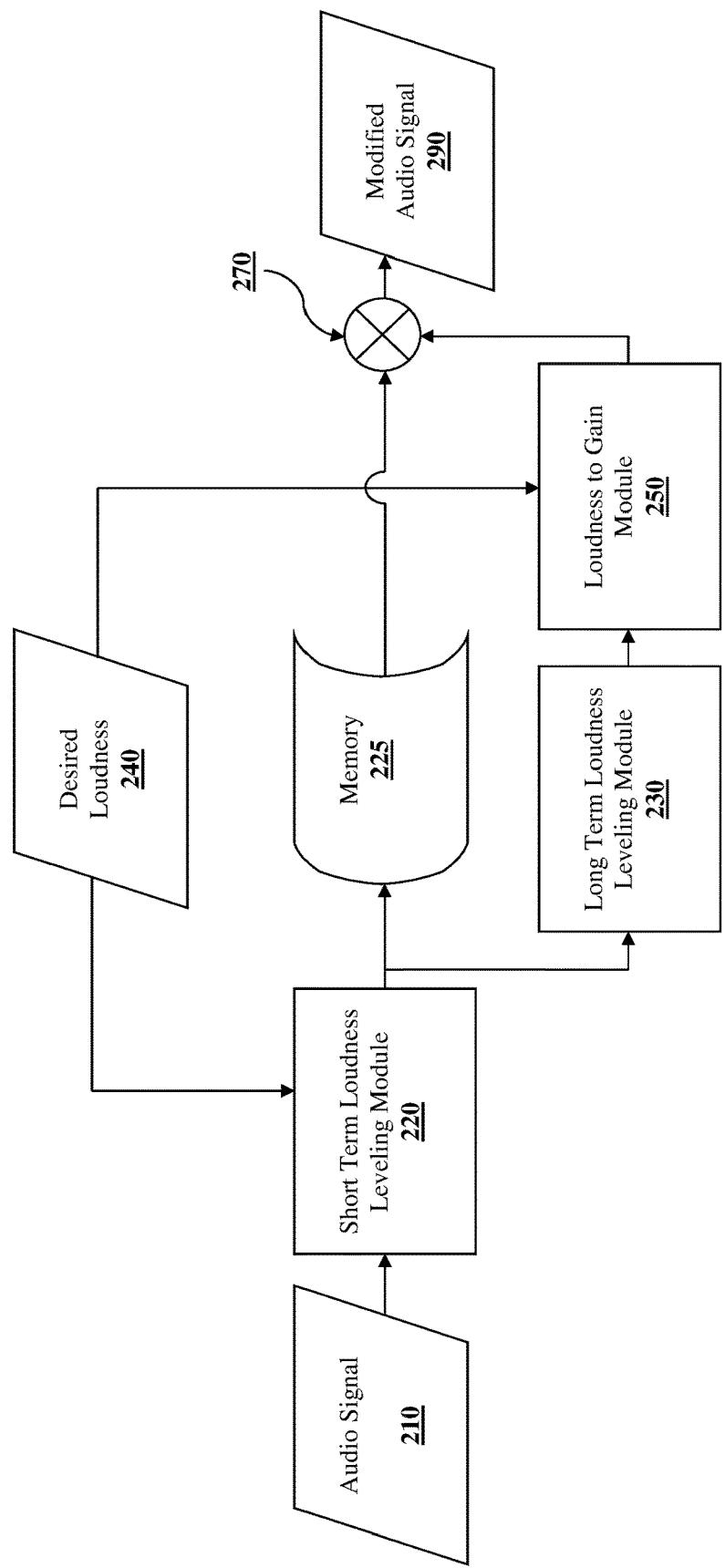
FIG. 2 is a schematic functional block diagram illustrating a system for leveling loudness variation in an audio signal offline according to an embodiment.

FIG. 2 is a schematic functional block diagram illustrating a system for leveling loudness variation offline according to one embodiment. In offline leveling, the whole audio signal is captured and stored, then processed through the method described with respect to FIG. 1. Audio signal 210 is processed by short term loudness leveling module 220, and stored in memory 225. Long term loudness leveling module 230 calculates a single loudness number over the whole audio signal or program. Loudness to gain module 250 calculates the gain value as the difference between desired loudness 240 and the loudness number. This gain value is applied at audio modification module 270 to produce modified audio signal 290.

Input Signal Adjustment

The audio signals input into the systems described above with respect to FIGS. 1 and 2 may have an average level that is well away from the desired loudness. In this situation, the system is almost always consistently either boosting or attenuating the audio signal. Audio signals such as these may have been authored well, i.e., they may have a fairly consistent average level, but their overall level may be shifted, e.g., due to a mismatch in reference levels when connecting and configuring various broadcast audio equipment. For example, the desired loudness may be −24 dB FS (full-scale), and the average level of the input audio signal consistently around −36 dB FS (full-scale). In such an example, the short term loudness leveling module is always boosting the audio signal by approximately 12 dB.

In one embodiment, the audio signal is not adjusted by the system if it is already close to the desired loudness. In other words, the system may implement a null-band. Thus, only signals outside of the null-band, i.e., that are significantly louder or quieter than the desired loudness, are modified to bring the signal closer in level to the desired loudness. An example null-band is a range between 4 dB quieter than the desired loudness to 4 dB louder than the desired loudness.

If an audio program is authored well but simply shifted, a slow gain adjustment may be applied according to one embodiment to move the level of the audio signal so that its average level is approximately the same as the desired loudness, before the signal is passed to the short term loudness leveling module. Thus, the short term loudness leveling module will not affect the audio signal as much, and only attenuates short term excessively loud signals, and only boosts short term very quiet signals.

Figure 3:
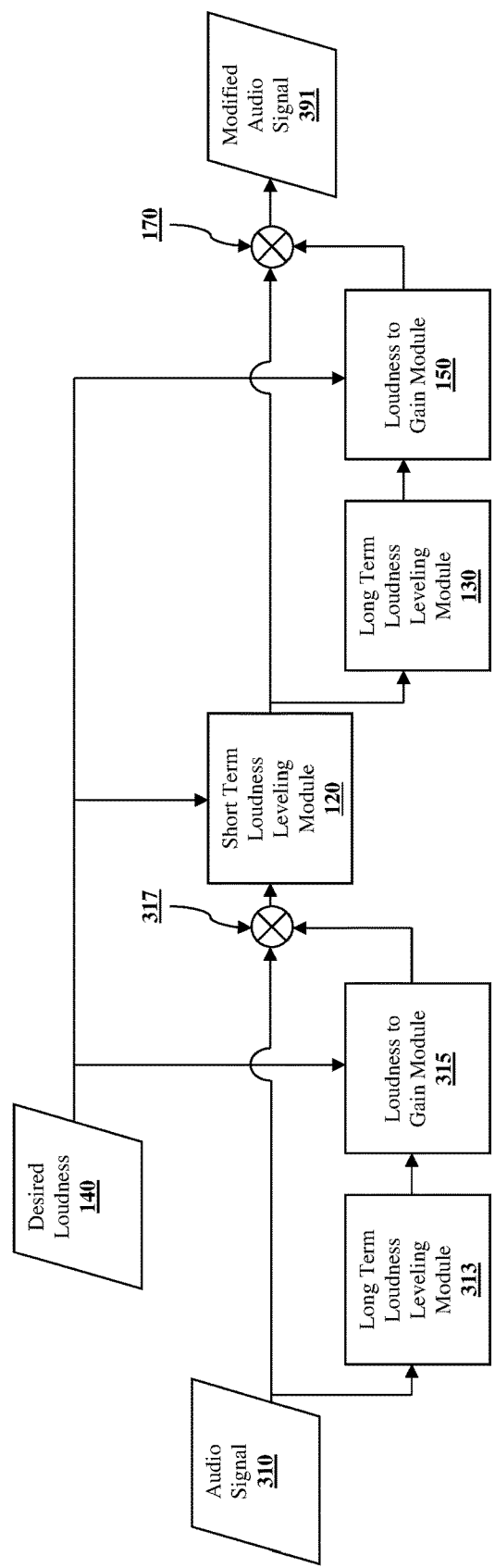
FIG. 3 is a schematic functional block diagram illustrating a system for leveling loudness variation with input signal adjustment in real-time according to an embodiment.
Figure 4:
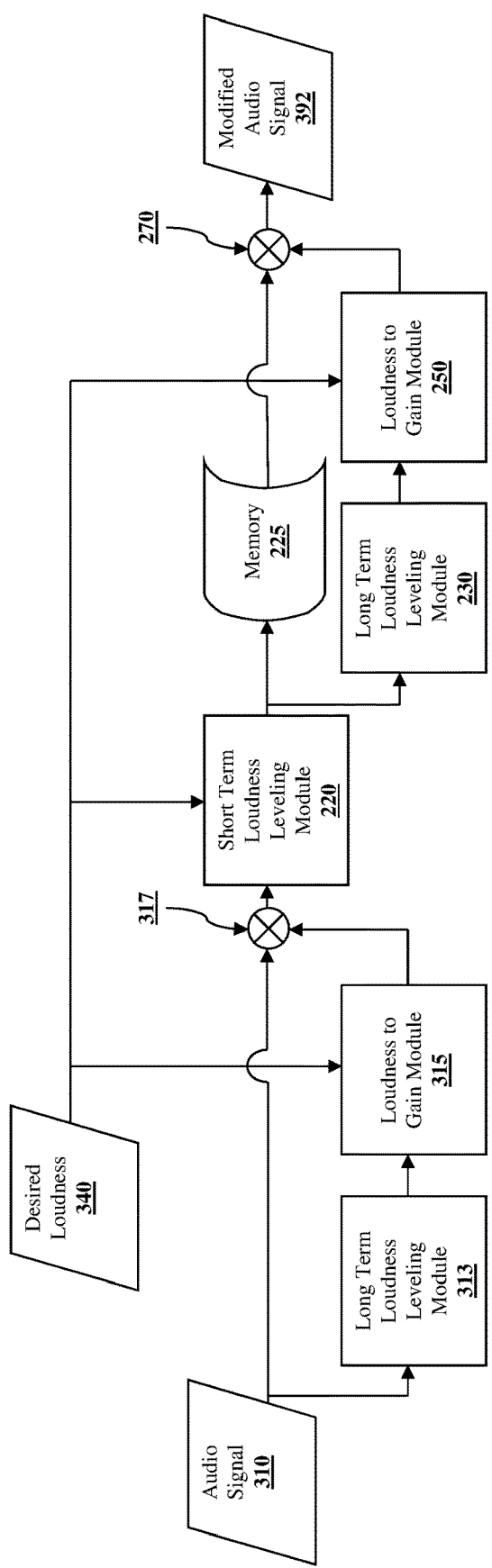
FIG. 4 is a schematic functional block diagram illustrating a system for leveling loudness variation with input signal adjustment offline according to an embodiment.

FIGS. 3 and 4 are schematic functional block diagrams illustrating systems for leveling loudness variation with input reference level adjustment in real-time and offline, respectively, according to an embodiment. Audio signal 310 is passed to a first long term loudness leveling module 313, which outputs a loudness number. In a digital system where the audio is a PCM signal, this number is typically expressed in units of dB relative to full-scale PCM. In one embodiment, the objective loudness measurement method used by long term loudness leveling module 313 is the same as is used by long term loudness leveling module 130 of FIG. 1.

Long term loudness leveling module 313 is set to a nominal integration time, e.g., 10 seconds. This integration time is the time interval of PCM samples which the module uses to calculate a single loudness number. Long term loudness leveling module 313 may operate more frequently than the integration time interval; however, each time it operates, it outputs a number representing a measurement over the last "integration time interval" PCM samples it has received. Long term loudness leveling module 313 can be operated at the same rate as short term loudness leveling module 120, e.g., every 5 milliseconds, or at a slower or faster rate. In one example, long term loudness leveling module 313 is operated every 20 milliseconds, or once for every 4 times short term loudness leveling module 120 is operated.

A first loudness to gain module 314 takes the loudness number received from long term loudness leveling module 313 and compares it to the desired loudness 140. Loudness to gain module 314 calculates the difference between the desired loudness and the loudness number, and outputs a first gain value. This gain, which is applied to audio signal 310 by a first audio modification module 317, bring the long term measure of audio signal 310 closer to desired loudness 140.

The calculation of the first gain value includes rate limiting to prevent the gain value from changing too quickly and causing audible artifacts. This is particularly important when the system begins operation, as long term loudness leveling module 313 has not yet received enough audio samples to output a relevant loudness number. In one embodiment, loudness to gain module 315 operates at the same rate as long term loudness leveling module 313, e.g., every 20 milliseconds, and the actual gain applied to the leveled audio signal is linearly interpolated between each of the first gain values calculated every 20 milliseconds. The first gain value can be calculated according to Equations 1-4.

In real-time leveling, after audio signal 310 is gain adjusted by the first gain value, it is passed to short term loudness leveling module 120, and processed according to the system described with respect to FIG. 1 for real-time leveling. That is, the adjusted audio signal is passed to short term loudness leveling module 120; long term loudness leveling module 130; loudness to gain module 150, and audio modification module 170, to produce modified audio signal 391.

In an embodiment in which offline leveling is used, long term loudness leveling module 313 can measure one loudness number for the whole audio signal. The whole audio signal can then be gain adjusted by the difference between the desired loudness 140 and the measurement from long term loudness leveling module 313. Once adjusted, audio signal 310 is then processed according to the system described with respect to FIG. 2. That is, the adjusted audio signal is passed to short term loudness leveling module 220, memory 225, long term loudness leveling module 230, loudness to gain module 250, and audio modification module 270, to produce modified audio signal 392.

Input Reference Level

In one embodiment, the short term loudness leveling modules described with respect to FIGS. 1-4 has an input called an input reference level. The input reference level indicates the nominal or average level of the audio signal that is passed into the short term loudness leveling module. The short term loudness leveling module performs two operations: adjusting or leveling the audio signal around the input reference level, and applying a fixed gain established by the difference between the desired loudness and the input reference level.

In one example, 85 corresponds to a nominal or average level of −31 dB full-scale (FS). The input reference level (IRL) is in dB's and may be calculated by Equation 5 below.

$$IRL = 54 - \text{AverageLevel (dBFS)} \qquad [5]$$

For example, a nominal value of −20 dB full-scale (FS) corresponds to an input reference level of 74.

By way of example, assuming digital PCM signals are used, if the desired loudness is −24 dB FS and the nominal level of the input audio signal is indicated by the input reference level as −10 dB FS, the short term loudness leveling module: (a) levels the audio either side of −10 dB FS, i.e., parts of the audio signal that are significantly quieter than −10 dB FS are boosted and parts that are significantly louder than −10 dB are attenuated, and (b) applies a bulk gain of −24−(−10)=−14 dB, i.e., 14 dB of attenuation. In other words, the null-band of the short term loudness leveling module is moved to be centered at the input reference level, or −10 dB FS in this example.

Figure 5:
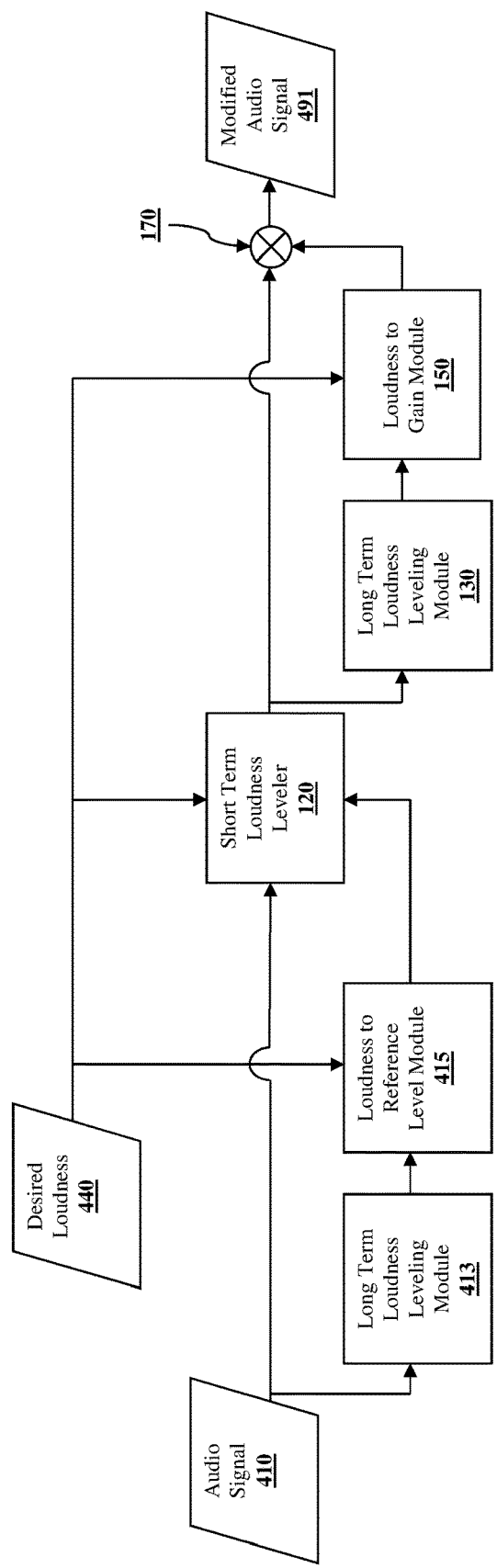
FIG. 5 is a schematic functional block diagram illustrating a system for leveling loudness variation with input reference level adjustment in real-time according to an embodiment.
Figure 6:
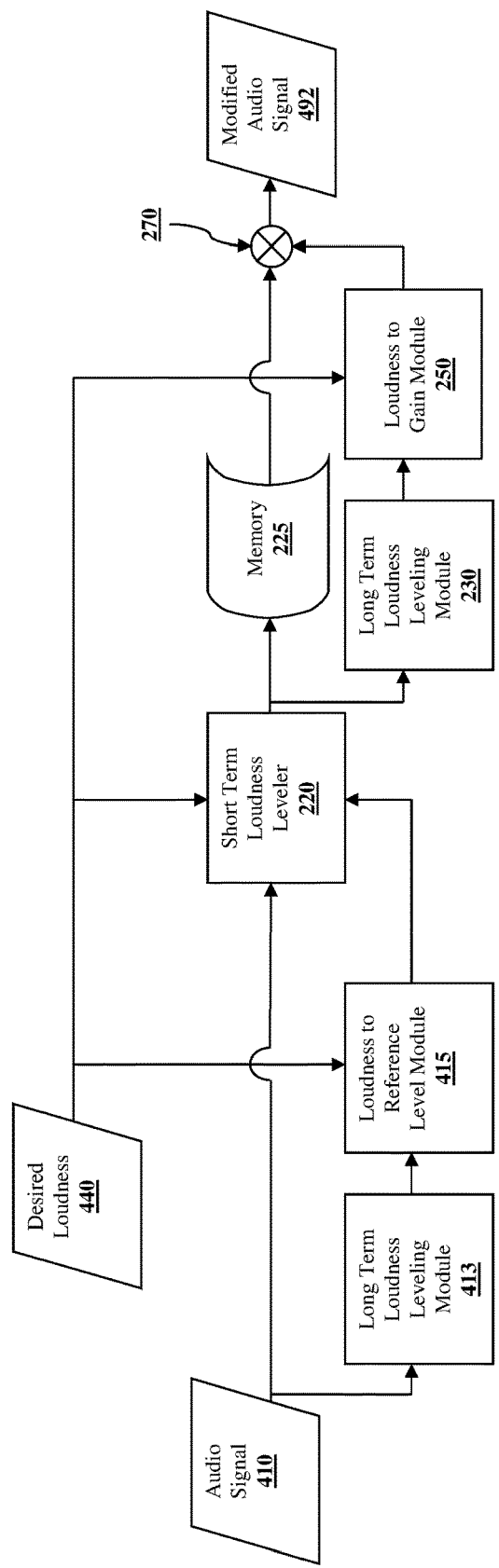
FIG. 6 is a schematic functional block diagram illustrating a system for leveling loudness variation with input reference level adjustment offline according to an embodiment.

FIGS. 5 and 6 are a schematic functional block diagrams illustrating systems for leveling loudness variation with input reference level adjustment in real-time and offline, respectively, according to an embodiment. Audio signal 410 is passed to a first long term loudness leveling module 413. In a digital system where the audio is a PCM signal, this number is typically expressed in units of dB relative to full-scale PCM. In one embodiment, the objective loudness measurement method used by long term loudness leveling module 413 is the same as is used by long term loudness leveling module 130 of FIG. 1.

Long term loudness leveling module 413 is set to a nominal integration time, e.g., 10 seconds. This integration time is the time interval of PCM samples which the module uses to calculate a single loudness number. Long term loudness leveling module 413 may operate more frequently than the integration time interval; however, each time it operates, it outputs a number representing a measurement over the last "integration time interval" PCM samples it has received. Long term loudness leveling module 413 can be operated at the same rate as short term loudness leveling module 120, e.g., every 5 milliseconds, or at a slower or faster rate. In one example, long term loudness leveling module 413 is operated every 20 milliseconds, or once for every 4 times short term loudness leveling module 120 is operated.

A loudness to reference level module 415 performs the calculations of Equations 1-4, then converts the gain value to an input reference level using the desired loudness 440 according to the following equation:

$$IRL = 54 - \text{DesiredLoudness} + GV \qquad [6]$$

In real-time leveling, after audio signal 410 is adjusted by the input reference level, it is passed to short term loudness leveling module 120, and processed according to the system described with respect to FIG. 1 for real-time leveling. That is, the adjusted audio signal is passed to short term loudness leveling module 120; long term loudness leveling module 130; loudness to gain module 150, and audio modification module 170, to produce modified audio signal 491.

In offline leveling, after audio signal 410 is adjusted by the input reference level, it is processed according to the system described with respect to FIG. 2. That is, the adjusted audio signal is passed to short term loudness leveling module 220, memory 225, long term loudness leveling module 230, loudness to gain module 250, and audio modification module 270, to produce modified audio signal 492.

Figure 7:
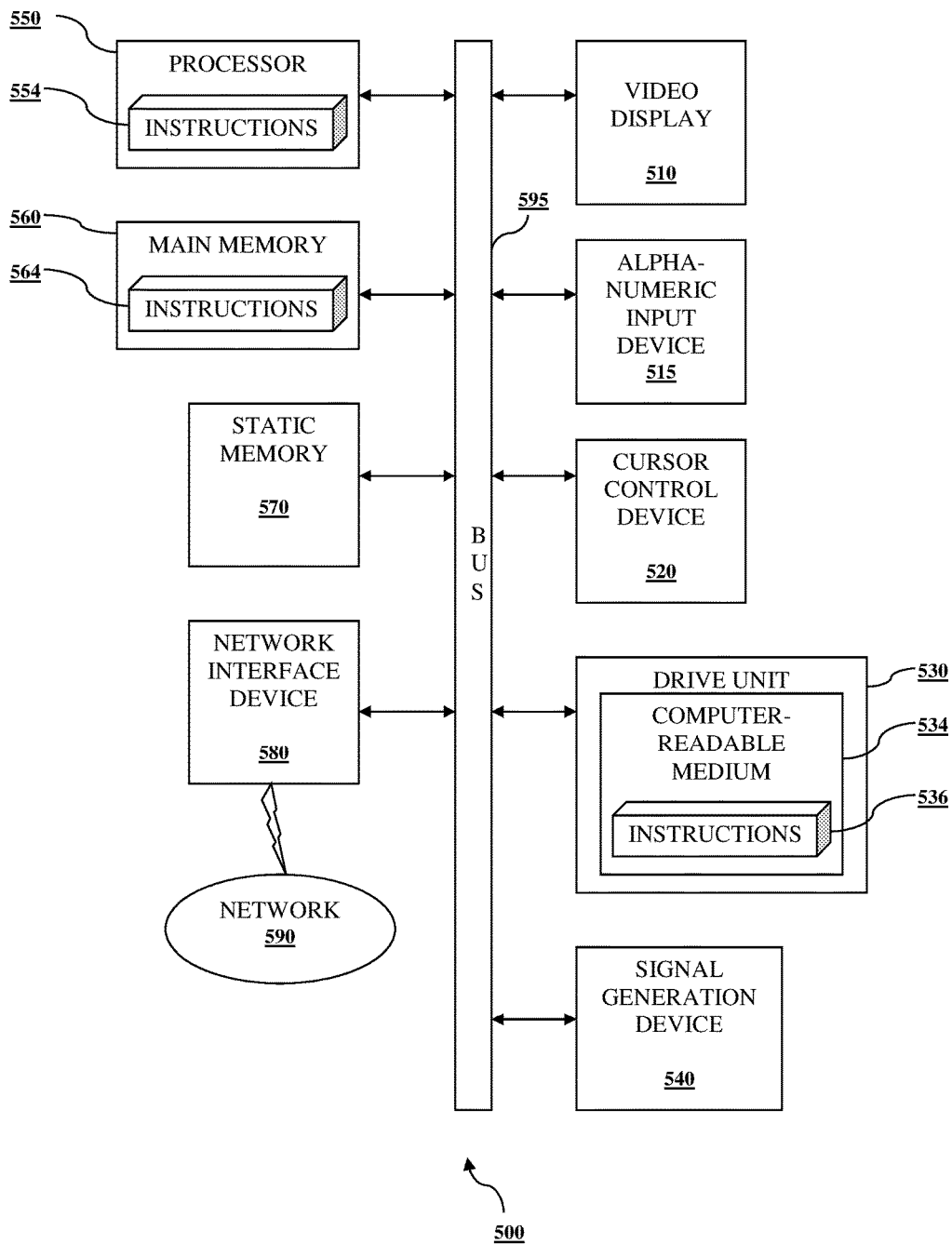
FIG. 7 is diagrammatic representation of a machine having a set of instructions for causing the machine to perform any of the one or more methods described herein.

FIG. 7 shows a diagrammatic representation of machine in the exemplary form of computer system 500 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, as a host machine, or as a peer machine in a peer-to-peer (or distributed) network environment. The machine may be a personal computer (PC), a tablet, a set-top box (STB), a Personal Digital Assistant (PDA), a cellular telephone, a web appliance, a network router, switch or bridge, a game console, a television, a CD player, a DVD player, a BD player, an e-reader, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

According to some embodiments, computer system 500 comprises processor 550 (e.g., a central processing unit (CPU), a graphics processing unit (GPU) or both), main memory 560 (e.g., read only memory (ROM), flash memory, dynamic random access memory (DRAM) such as synchronous DRAM (SDRAM) or Rambus DRAM (RDRAM), etc.) and/or static memory 570 (e.g., flash memory, static random access memory (SRAM), etc.), which communicate with each other via bus 595.

According to some embodiments, computer system 500 may further comprise video display unit 510 (e.g., a liquid crystal display (LCD), a light-emitting diode display (LED), an electroluminescent display (ELD), plasma display panels (PDP), an organic light-emitting diode display (OLED), a surface-conduction electron-emitted display (SED), a nanocrystal display, a 3D display, or a cathode ray tube (CRT)). According to some embodiments, computer system 500 also may comprise alphanumeric input device 515 (e.g., a keyboard), cursor control device 520 (e.g., a controller or mouse), disk drive unit 530, signal generation device 540 (e.g., a speaker), and/or network interface device 580.

Disk drive unit 530 includes computer-readable medium 534 on which is stored one or more sets of instructions (e.g., software 536) embodying any one or more of the methodologies or functions described herein. Software 536 may also reside, completely or at least partially, within main memory 560 and/or within processor 550 during execution thereof by computer system 500, main memory 560 and processor 550. Processor 550 and main memory 560 can also constitute computer-readable media having instructions 554 and 564, respectively. Software 536 may further be transmitted or received over network 590 via network interface device 580.

While computer-readable medium 534 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the disclosed embodiments. The term "computer-readable medium" shall accordingly be taken to include, but not be limited to, solid-state memories, and optical and magnetic media.

It should be understood that processes and techniques described herein are not inherently related to any particular apparatus and may be implemented by any suitable combination of components. Further, various types of general purpose devices may be used in accordance with the teachings described herein. It may also prove advantageous to construct a specialized apparatus to perform the methods described herein. Those skilled in the art will appreciate that many different combinations of hardware, software, and firmware will be suitable for practicing the disclosed embodiments.

Embodiments have been described in relation to particular examples, which are intended in all respects to be illustrative rather than restrictive. Further, while embodiments have been described in connection with a number of examples and implementations, it is understood that various modifications and equivalent arrangements can be made to the examples while remaining within the scope of the inventive embodiments.

Other embodiments will be apparent to those skilled in the art from consideration of the specification and practice of the embodiments disclosed herein. Various aspects and/or components of the described embodiments may be used singly or in any combination. It is intended that the specification and examples be considered as exemplary only, with a true scope and spirit of the disclosure being indicated by the following claims.

What is claimed is:

1. A system for leveling loudness variation in an audio signal, the system comprising:
 a short term loudness leveling processor configured to receive the audio signal and a desired loudness of the audio signal, and configured to adjust a short term loudness of the audio signal using a short term integration time, to yield an adjusted audio signal, wherein adjusting the short term loudness comprises using spectral analysis and models of human hearing to adjust the audio signal;
 a long term loudness leveling processor configured to measure an actual loudness of the adjusted audio signal using a long term integration time, wherein the long term integration time is longer than the short term integration time;
 a loudness to gain processor configured to calculate a gain value using a difference between the desired loudness and the actual loudness of the adjusted audio signal; and
 an audio modification processor configured to modify the adjusted audio signal using the gain value,
 wherein the long term loudness level processor selectively operates in one of a first mode and a second mode,
 wherein in the first mode, the long term loudness level processor measures the actual loudness of the adjusted audio signal only when the adjusted audio signal is classified as dialogue, and
 wherein in the second mode, the long term loudness level processor measures the actual loudness of the adjusted audio signal according to a level-based gating technique.

2. The system of claim 1, wherein the short term integration time is shorter than the long term integration time.

3. The system of claim 1, wherein the long term loudness leveling processor operates at a first rate, and wherein the short term loudness leveling processor operates at a second rate.

4. The system of claim 3, wherein the first rate is faster than the second rate.

5. The system of claim 3, wherein the first rate is slower than the second rate.

6. The system of claim 3, wherein the first rate and the second rate are a same rate.

7. The system of claim 1, further comprising:
a memory, wherein the long term loudness leveling processor is configured to measure the actual loudness of the adjusted audio signal over the entire adjusted audio signal.

8. The system of claim 1, wherein the loudness to gain processor uses rate limiting when calculating the gain value.

9. The system of claim 1, wherein the long term loudness level processor is configured to measure the actual loudness of the adjusted audio signal according to an objective loudness measurement standard.

10. A method of leveling loudness variation in an audio signal, the method comprising:
receiving the audio signal and a desired loudness of the audio signal;
adjusting a short term loudness of the audio signal using a short term integration time, to yield an adjusted audio signal, wherein adjusting the short term loudness comprises using spectral analysis and models of human hearing to adjust the audio signal;
measuring an actual loudness of the adjusted audio signal using a long term integration time, wherein the long term integration time is longer than the short term integration time;
calculating a gain value using a difference between the desired loudness and the actual loudness of the adjusted audio signal; and
modifying the adjusted audio signal using the gain value,
wherein measuring the actual loudness comprises selectively operating in one of a first mode and a second mode,
wherein in the first mode, the actual loudness of the adjusted audio signal is measured only when the adjusted audio signal is classified as dialogue, and
wherein in the second mode, the actual loudness of the adjusted audio signal is measured according to a level-based gating technique.

11. The method of claim 10, wherein the short term integration time is shorter than the long term integration time.

12. The method of claim 10, wherein measuring the actual loudness occurs at a first rate, and wherein adjusting the short term loudness occurs at a second rate.

13. The method of claim 12, wherein the first rate is faster than the second rate.

14. The method of claim 12, wherein the first rate is slower than the second rate.

15. The method of claim 12, wherein the first rate and the second rate are a same rate.

16. The method of claim 10, wherein measuring the actual loudness occurs over the entire adjusted audio signal.

17. The method of claim 10, wherein calculating the gain value includes using rate limiting when calculating the gain value.

18. The method of claim 10, wherein measuring the actual loudness of the adjusted audio signal is performed according to an objective loudness measurement standard.

19. A non-transitory computer readable medium having computer executable instructions embedded thereon for performing, when executed by a processor, a method of leveling loudness variation in an audio signal, the method comprising:
receiving the audio signal and a desired loudness of the audio signal;
adjusting a short term loudness of the audio signal using a short term integration time, to yield an adjusted audio signal, wherein adjusting the short term loudness comprises using spectral analysis and models of human hearing to adjust the audio signal;
measuring an actual loudness of the adjusted audio signal using a long term integration time, wherein the long term integration time is longer than the short term integration time;
calculating a gain value using a difference between the desired loudness and the actual loudness of the adjusted audio signal; and
modifying the adjusted audio signal using the gain value,
wherein measuring the actual loudness comprises selectively operating in one of a first mode and a second mode,
wherein in the first mode, the actual loudness of the adjusted audio signal is measured only when the adjusted audio signal is classified as dialogue, and
wherein in the second mode, the actual loudness of the adjusted audio signal is measured according to a level-based gating technique.

20. The non-transitory computer readable medium of claim 19, wherein measuring the actual loudness occurs at a first rate, and wherein adjusting the short term loudness occurs at a second rate.

* * * * *